United States Patent
Horiuchi et al.

(10) Patent No.: US 6,455,786 B1
(45) Date of Patent: Sep. 24, 2002

(54) WIRING BOARD AND MANUFACTURING METHOD THEREOF AND SEMICONDUCTOR DEVICE

(75) Inventors: Michio Horiuchi, Nagano (JP); Shigetsugu Muramatsu, Nagano (JP); Shigeru Mizuno, Nagano (JP); Takashi Kurihara, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/539,117

(22) Filed: Mar. 30, 2000

(51) Int. Cl.⁷ .................................................. H05K 1/16
(52) U.S. Cl. ...................... 174/260; 174/261; 257/783
(58) Field of Search ................................ 174/260, 261, 174/255; 257/783

(56) References Cited

U.S. PATENT DOCUMENTS

| | | | |
|---|---|---|---|
| 5,953,592 A | * 9/1999 | Taniguchi et al. | 438/118 |
| 6,118,183 A | * 9/2000 | Umehara et al. | 257/783 |
| 6,153,448 A | * 11/2000 | Takahashi et al. | 438/114 |
| 6,194,778 B1 | * 2/2001 | Ohsawa et al. | 257/668 |
| 6,201,266 B1 | * 3/2001 | Ohuchi et al. | 257/106 |
| 6,204,564 B1 | * 3/2001 | Miyata et al. | 257/778 |
| 6,249,046 B1 | * 6/2001 | Hashimoto | 257/691 |

FOREIGN PATENT DOCUMENTS

| | | |
|---|---|---|
| JP | 9-219463 | 8/1997 |
| JP | 10-107172 | 4/1998 |

* cited by examiner

Primary Examiner—Kamand Cuneo
Assistant Examiner—José H. Alcalá
(74) Attorney, Agent, or Firm—Pennie & Edmonds LLP (57) ABSTRACT

A wiring board and electrode of a semiconductor element are connected with each other by the method of wire bonding, and problems arising from the thermal stress generated in the process of mounting are overcome. There is provided a wiring board comprising: a first face joined to an electrode forming face of a semiconductor element 10; and a second face on the opposite side of the first face, a wiring pattern 16 being formed on the second face, a land 24 joined to an external connecting terminal 22 being formed at one end of the wiring pattern, a wire bonding section 16a connected with a bonding wire 40 being formed at the other end of the wiring pattern, wherein the land 24 is supported by a buffer layer 34 for reducing the thermal stress generated when the semiconductor element, to which the wiring board is attached, is mounted via the external connecting terminals, and the wire bonding section 16a is supported by a bonding support layer 36 having an elastic modulus capable of allowing wire bonding.

12 Claims, 9 Drawing Sheets

WIRING BOARD AND MANUFACTURING METHOD THEREOF AND SEMICONDUCTOR DEVICE

FIELD OF THE INVENTION

The present invention relates to a wiring board used for manufacturing a semiconductor device of substantially the same size. The present invention also relates to a method of manufacturing the wiring board and a semiconductor device into which the wiring board is incorporated.

DESCRIPTION OF THE BACKGROUND ART

In a chip-size package, the size of which is substantially the same as that of the semiconductor to be incorporated into the package, there is provided an interposer between the semiconductor element and the external connecting terminals such as solder balls. The interposer is provided with wiring for electrically connecting the electrode of the semiconductor element with the external connecting terminals. This interposer is made of flexible material, so that the thermal stress generated by a difference between the coefficient of thermal expansion of the package and that of a mounting board can be reduced.

Figure 12:
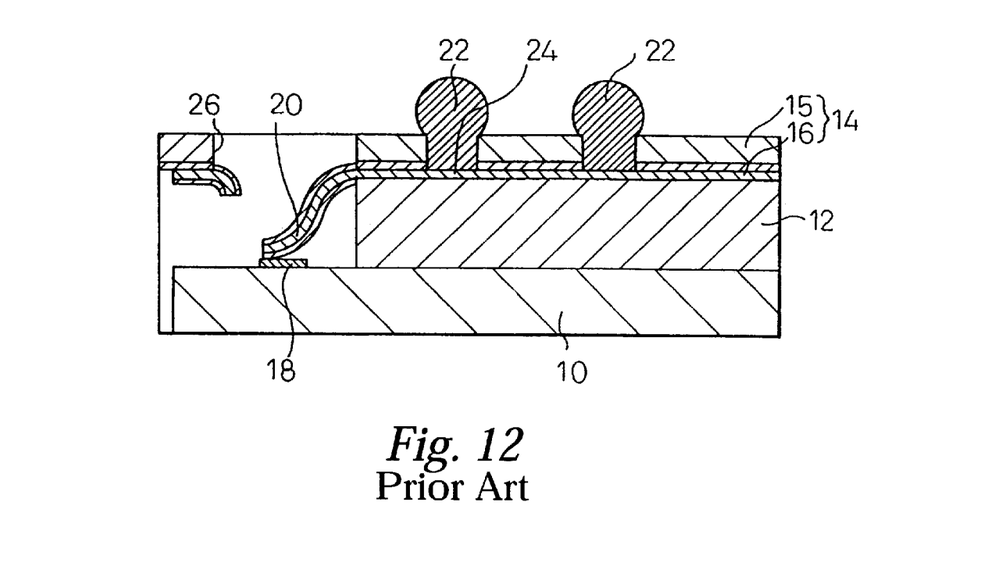
FIG. 12 is a cross-sectional view showing an arrangement of a conventional semiconductor device made by the method of lead bonding.

FIG. 12 is a view showing an example of the conventional BGA (ball grid array) type chip-size package. This semiconductor device is composed in such a manner that a wiring pattern film 14 adheres onto an electrode forming face of a semiconductor element 10 via an elastomer layer 12. The wiring pattern film 14 is supported by an electrically insulating layer 15, and a wiring pattern 16 is formed on the wiring pattern film 14. At one end of the wiring pattern 16, there is provided a lead 20 connected with the electrode 18 of the semiconductor element 10, and at the other end of the wiring pattern 16, there is provided a land 24 which is a part of wiring pattern 16 that is immediately adjacent to, below, and connected with the external connecting terminal 22. In this product, both the elastomer layer 12 and the wiring pattern film 14 become an interposer.

The lead 20 and the electrode 18 are individually connected with each other by the method of lead bonding. The lead 20 is formed crossing a window 26 formed on the wiring pattern film 14. Therefore, the lead 20 is connected with the electrode 18 in the process of lead bonding in such a manner that the lead 20 is cut off by a bonding tool through the window 26.

However, it is not necessarily easy to bond the lead 20 to the electrode 18 with high accuracy by the method of lead bonding. Further, the working efficiency of lead bonding is not necessarily high. In order to overcome the above problems, it is possible to use the method of wire bonding, the working efficiency of which is high, for connecting the wiring pattern 16 with the electrode 18.

However, when wire bonding is conducted on the wiring pattern film 14 supported by the above flexible elastomer layer 12, it is impossible to perform the bonding with high accuracy. The reason for this is as follows. Since the elastomer layer 12 is made of flexible material so as to reduce thermal stress, the pushing force exerted by the bonding tool does not act on the bonding section effectively. Therefore, the bonding wire cannot be assuredly connected.

On the other hand, when the wiring pattern film 14 is made of material the elastic modulus of which is high, instead of the flexible elastomer layer 12, so that the wire bonding property of the wiring pattern 16 can be enhanced, the following problems may be encountered. When the semiconductor device is mounted on a mounting board, thermal stress generated between the mounting board and the semiconductor element 10 acts directly on the external connecting terminals 22. Therefore, an excessively high intensity of stress acts between the external connecting terminal 22 and the mounting board and also between the external connecting terminal 22 and the semiconductor element 10, which could cause of a defective connection.

SUMMARY OF THE INVENTION

It is an object of the present invention to provide a semiconductor device in which the electrode of the semiconductor element and the external connecting terminal can be assuredly connected with each other by the method of wire bonding in a semiconductor device including an interposer functioning as a wiring board arranged between the semiconductor element and the external connecting terminal. It is another object of the present invention to provide a wiring board suitably for use in manufacturing the semiconductor device. It is still another object of the present invention to provide a method of manufacturing the semiconductor device.

In order to realize the above objects, the present invention provides a wiring board comprising: a first face joined to an electrode forming face of a semiconductor element; and a second face on the opposite side of the first face, a wiring pattern being formed on the second face, a land joined to an external connecting terminal being formed at one end of the wiring pattern, a wire bonding section connected with a bonding wire being formed at the other end of the wiring pattern, wherein the land is supported by a buffer layer for reducing the thermal stress generated when the semiconductor element to which the wiring board is attached is mounted via the external connecting terminals, and the wire bonding section is supported by a bonding support layer having an elastic modulus capable of allowing wire bonding.

The buffer layer is made of material the Young's modulus of which is not more than 1 GPa at 30° C., and the bonding layer is made of material the Young's modulus of which is not less than 4 GPa at room temperature.

A plurality of wire bonding sections are arranged in a peripheral section of the second face, and a plurality of lands are arranged inside the region in which the wire bonding sections are arranged. Alternatively, an opening penetrating from the first face to the second face is formed, a plurality of wire bonding sections are arranged in a peripheral section of the opening on the second face, and a plurality of lands are arranged outside the region in which the wire bonding sections are arranged.

The buffer layer and the bonding support layer are supported by a base support layer the elastic modulus of which is the same as that of the bonding support layer, a side of the base support layer composes the first face, and sides of the buffer layer and the bonding support layer compose the second face.

A plane configuration of a wiring pattern formed on the second face is formed into a curve.

The present invention provides a method of manufacturing a wiring board having a first face joined to an electrode forming face of a semiconductor element and also having a second face on the opposite side of the first face, a wiring pattern being formed on the second face, a land joined to an external connecting terminal being formed at one end of the wiring pattern, a wire bonding section connected with a bonding wire being formed at the other end of the wiring pattern, the method of manufacturing the wiring board comprising the steps of: forming a support sheet made of material the elastic modulus of which is so high that it can support bonding in the process of wire bonding, the support sheet partitioning cavities when a partitioning section which becomes a bonding support layer is arranged on one of the faces of the support sheet, forming a buffer layer when cavities are filled with adhesive sheet material by pressing a sheet of metallic foil on a side on which the cavities of the support sheet are formed, via an adhesive sheet made of material capable of reducing the thermal stress caused when the semiconductor element having the wiring board is mounted via the external connecting terminal, making the buffer layer and the bonding support layer adhere onto the sheet of copper foil, and etching the sheet of metallic foil so as to form a wiring pattern on which one end side becomes lands arranged in a region supported by the buffer layer and the other end side becomes a wire bonding section arranged in a region supported by the bonding support layer.

The present invention also provides another method of manufacturing a wiring board having a first face joined to an electrode forming face of a semiconductor element and also having a second face on the opposite side of the first face, a wiring pattern being formed on the second face, a land joined to an external connecting terminal being formed at one end of the wiring pattern, a wire bonding section connected with a bonding wire being formed at the other end of the wiring pattern, the method of manufacturing the wiring board comprising the steps of: forming a support sheet made of material the elastic modulus of which is so high that it can support bonding in the process of wire bonding, the support sheet partitioning cavities when a partitioning section which becomes a bonding support layer is arranged on one of the faces of the support sheet, forming a buffer layer by filling the cavities with material capable of reducing the thermal stress which is caused when the semiconductor element having the wiring board is mounted via the external connecting terminals, so that a surface of the filled material can be the same as the surface of the support sheet; covering the surface of the support sheet on which the buffer layer is formed with a sheet of metallic foil; and etching the sheet of metallic foil so as to form a wiring pattern on which one end side becomes lands arranged in a region supported by the buffer layer and the other end side becomes a wire bonding section arranged in a region supported by the bonding support layer.

The present invention provides a semiconductor device comprising: a semiconductor element on the electrode forming face of which an electrode is formed; a wiring board having a first face joined to an electrode forming face of the semiconductor element and also having a second face on the opposite side of the first face, a wiring pattern being formed on the second face, a land joined to an external connecting terminal being formed at one end of the wiring pattern, a wire bonding section connected with a bonding wire being formed at the other end of the wiring pattern; and a bonding wire for electrically connecting the electrode of the semiconductor element with the wire bonding section of the wiring board, wherein the land is supported by a buffer layer for reducing the thermal stress caused when the semiconductor element having the wiring board is mounted via the external connecting terminal, and the wire bonding section is supported by a bonding support layer the elastic modulus of which is capable of allowing wire bonding.

The present invention also provides a method of manufacturing a semiconductor device comprising the steps of: preparing a semiconductor wafer provided with a plurality of semiconductor elements on the electrode forming faces of which the electrodes are formed; preparing an individual wiring board having a first face joined to the electrode forming face of the semiconductor element and also having a second face arranged on the opposite side to the first face, a wiring pattern being formed on the second face, a land joined to an external connecting terminal being arranged at one end of the wiring pattern, a wire bonding section connected with a bonding wire being arranged at the other end of the wiring pattern; mounting an individual wiring board on the semiconductor wafer corresponding to each semiconductor element so the electrode can be exposed; connecting electrically the electrode with the bonding section of the wiring board by a bonding wire; sealing a region including the electrode, bonding section and bonding wire section with resin; and cutting the semiconductor wafer at a position sealed with the sealing resin along a cutting line between the adjacent semiconductor elements so as to separate it into individual semiconductor elements.

Further, the present invention provides a method of manufacturing a semiconductor device, additionally comprising the step of connecting an external connecting terminal with the land of each wiring board after the process of sealing the electrode, bonding section and bonding wire section with resin.

The present invention provides another method of manufacturing a semiconductor device comprising the steps of: preparing a large size wiring board in which a plurality of openings penetrating from the first face to the second face on the opposite side are arranged in a grid pattern, the individual wiring boards are formed in the periphery of the individual openings, the first face of each wiring board becomes a face joined to the electrode forming face of the semiconductor element, the wiring pattern is formed on the second face, the land connected with the external connecting terminal is provided at one end of the wiring pattern, and the wire bonding section connected with the bonding wire is provided at the other end of the wiring pattern; preparing each semiconductor element, in the central region of the electrode forming face of which the electrode is formed; mounting each semiconductor element on the large size wiring board corresponding to each wiring board so that the electrode can be exposed from the opening; electrically connecting the electrode of the semiconductor element with the bonding section of the wiring board by a bonding wire; sealing a region including the electrode, bonding section and bonding wire section with resin; and cutting the large size wiring board at a position sealed with the sealing resin along a cutting line between the adjacent semiconductor elements so as to separate it into individual semiconductor elements.

BRIEF DESCRIPTION OF THE DRAWINGS

FIGS. 2(a) and 2(b) are schematic illustrations showing a method of manufacturing a wiring board, wherein

THE MOST PREFERRED EMBODIMENT

The most preferred embodiment of the present invention will be explained in detail as follows.

Figure 1:
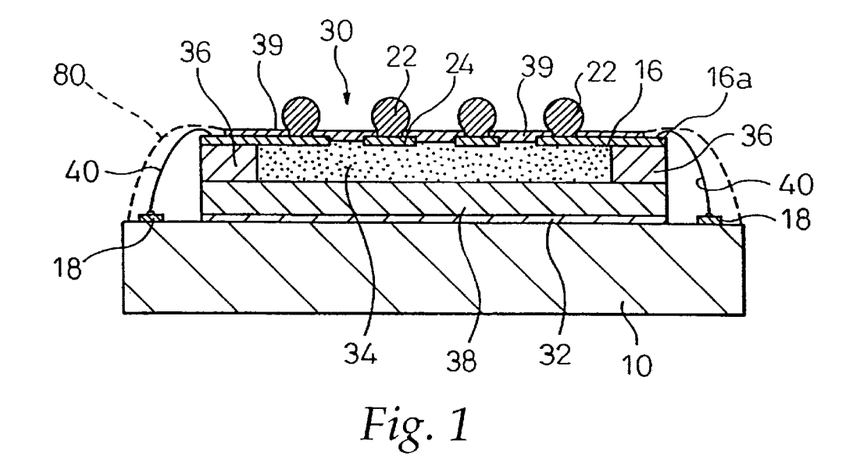
FIG. 1 is a cross-sectional view showing an arrangement of a semiconductor device of the present invention.

FIG. 1 is a cross-sectional view showing an arrangement of an embodiment of a semiconductor device of the present invention. In the drawing, reference numeral 10 is a semiconductor element, and reference numeral 18 is an electrode provided on an electrode forming face of the semiconductor element 10. Reference numeral 30 is a wiring board for electrically connecting the electrode 18 with an external connecting terminal 22. This wiring board 30 is made to adhere onto an electrode forming face of the semiconductor element 10. A main body of the wiring board 30 includes: a buffer layer 34 arranged in a region for supporting the external connecting terminal 22; a bonding support layer 36 arranged in a region for supporting a wire bonding section 16a of a wiring pattern 16; and a base support layer 38 for supporting all the lower faces of the buffer layer 34 and the bonding support layer 36.

In the semiconductor device of this embodiment, the electrodes 18 of the semiconductor element 10 are arranged in the periphery of the electrode forming face. Therefore, the wiring board 30 is mounted in a region inside the peripheral region in which the electrodes 18 are arranged on the electrode forming face of the semiconductor element 10, and the wire bonding sections 16a are arranged in the periphery of the wiring board 30. Accordingly, the bonding support layer 36 for supporting the wire bonding sections 16a is arranged in the periphery of the wiring board 30 in a frame-shape, and the buffer layer 34 is formed in a region inside the bonding support layer 36.

One end of the wiring pattern 16 is formed at the land 24 joined to the external connecting terminal 22, and the end of the wiring pattern 16 is formed at the wire bonding section 16a. As shown in FIG. 1, the lands 24 are arranged in the region of the buffer layer 34, and the wiring pattern 16 is drawn out from the lands 24 to the periphery of the wiring board 30 and formed at the wire bonding sections 16a.

Reference numeral 39 is a protective film for covering and protecting a surface of the wiring board 30. However, the lands 24 and the wire bonding sections 16a are exposed from the protective film 39.

The semiconductor device of this embodiment is characterized in that the wiring pattern 16 on the wiring board 30 is electrically connected with the electrodes 18 of the semiconductor element 10 by the method of wire bonding. Reference numeral 40 is a bonding wire for electrically connecting the wire bonding section 16a of the wiring pattern 16 with the electrode 18 of the semiconductor element 10.

The bonding support layer 36 is made of material having a predetermined elastic modulus so that wire bonding can be assuredly accomplished; for example, the bonding support layer 36 is made of a film of polyimide. In the same manner, the base support layer 38 is made of a film of polyimide having a predetermined elastic modulus.

In this connection, after the bonding wires 40 have been stretched, a region of the bonding wires 40 is sealed by the method of potting. Resin 80 for sealing the bonding wires 40 is not necessarily flexible, i.e. resin 80 may be the same material as that composing the bonding support layer 36 and the base support layer 38.

The buffer layer 34 is provided in order to reduce the thermal stress generated between the semiconductor element 10 and the mounting board when the semiconductor device is mounted on the mounting board. Therefore, the buffer layer 34 is made of flexible material having a predetermined low elastic modulus. When the external connecting terminals 22 are supported by the buffer layer 34, it becomes possible to significantly reduce the thermal stress generated when the semiconductor device is mounted on the mounting board.

Since the wiring board 30 of the semiconductor device of this embodiment is composed as described above, the wire bonding sections 16a and the bonding wires are bonded to each other in a satisfactory state. Therefore, it becomes possible to easily connect the wiring pattern 16 with the electrode 18 of the semiconductor element 10 by the method of wire bonding. According to this connecting method of wire bonding, connecting can be conducted more easily and stably than the conventional connecting method of lead bonding. When the method of wire bonding, which is commonly used, is adopted, it becomes possible to conduct working effectively and the manufacturing cost can be decreased.

A method of manufacturing the wiring board 30 used for the above semiconductor device will be explained below.

Figure 2A:
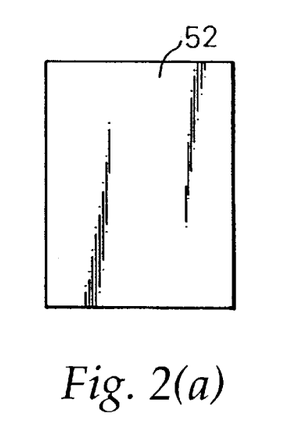
FIG. 2(a) is a plan view showing a base sheet.
Figure 2B:
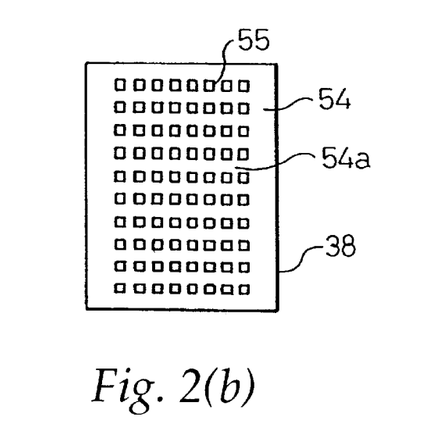
FIG. 2(b) is a plan view showing a frame-shaped sheet.
Figure 3:
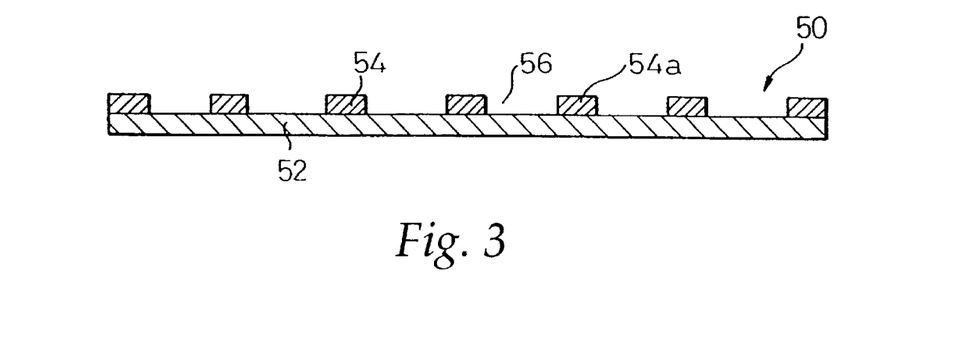
FIG. 3 is a cross-sectional view showing a state in which the frame-shaped sheet is joined to a base sheet.

FIGS. 2(a), 2(b) and 3 are views showing a method of making a support sheet 50 having a bonding support sheet 36 and base support sheet 38 by using a base sheet 52 and frame-shaped sheet 54. FIG. 2(a) is a view showing the base sheet 52 which becomes in subsequent manufacturing processes the base support sheet 38 shown in FIGS. 5c and 6. The base sheet 52 is a flat sheet made of a film of elastic material. FIG. 2(b) is a view showing the frame shaped sheet 54 which becomes in subsequent manufacturing processes the bonding support sheet 36 shown in FIGS. 5c and 6. On the frame-shaped sheet 54, through-holes 55 of a predetermined shape are formed for making cavities which become the buffer layer 34.

FIG. 3 is a cross-sectional view of the support sheet 50 formed when the frame-shaped sheet 54 is made to adhere onto the base sheet 52. On one of the faces of the support sheet 50, cavities 56 are formed being partitioned by the partitioning section 54a of the frame-shaped sheet 54.

Figure 5A:
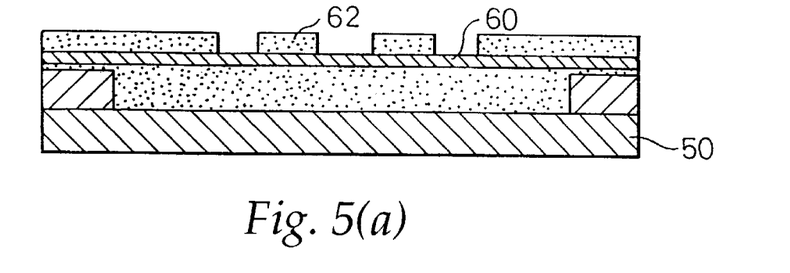
FIGS. 5(a) and 5(c) are schematic illustrations showing a method of manufacturing a wiring board.
Figure 5B:
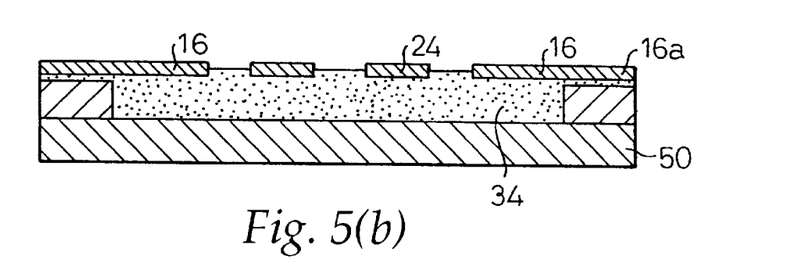
Figure 5C:
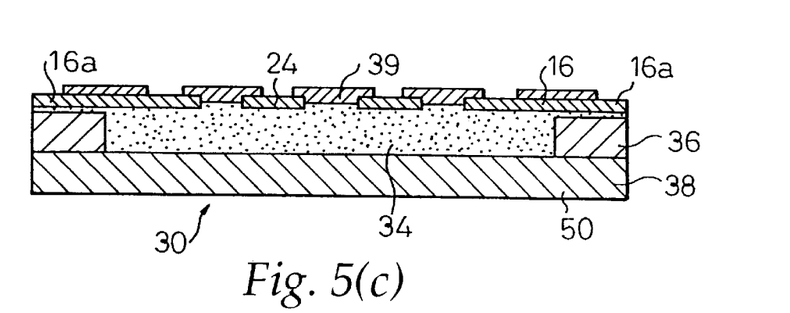

Each region partitioned by the partitioning section 54a of the frame-shaped sheet 54 becomes after subsequent manufacturing processes one wiring board 30 as shown in FIG. 5c. When the large size base sheet 52 and the frame-shaped sheet 54 are used, the wiring boards 30 can e satisfactorily provided.

In this connection, the present invention is not limited to this specific method, by which the support sheet 50 is formed when the frame-shaped sheet 54 is made to adhere onto the base sheet 52. It is possible to form the support sheet 50 having the cavities 56 shown in FIG. 3 by the method of integral molding. In this case, the bonding support layer 36 and the base support layer 38 are integrally formed on the wiring board 30. The bonding support layer 36 is formed integrally with the base support layer 38 as described above.

In consideration of the wire bonding properties, the elastic modulus of the base sheet 52 and that of the frame-shaped sheet 54 must be a predetermined value. Usually, in order to obtain an excellent state of wire bonding, it is sufficient that the Young's modulus of the base sheet 52 and that of the frame-shaped sheet 54 be approximately 4 GPa at room temperature.

Examples of the material of the base sheet 52 and the frame-shaped sheet 54 having the aforementioned elastic modulus are: resins such as polyimide resin, epoxy resin and PPE; and glass cloth and no-woven fabric of high polymer impregnated with the above resins. It is also possible to use metal such as copper, nickel, alloy of Fe—Ni, and it is further possible to use ceramics such as alumina and aluminum nitride.

Figure 4A:
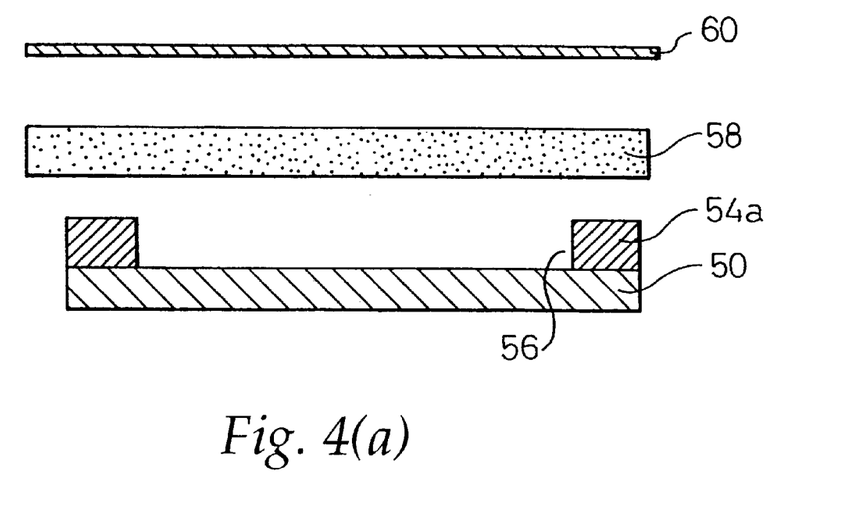
FIGS. 4(a) and 4(b) are schematic illustrations showing a method of making a sheet of copper foil adhere onto a support sheet.
Figure 4B:
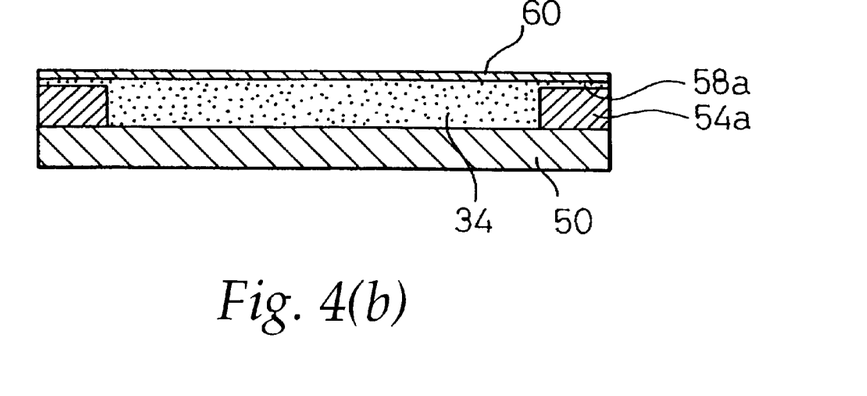

FIGS. 4(a) and 4(b) are views showing a process of making a sheet of copper foil 60 adhere onto the support sheet 50 by using an adhesive sheet 58. In these drawings, one cavity 56 on the support sheet 50 is shown enlarged. However, the sheet of copper foil 60 is actually made to adhere onto the entire face of the support sheet 50.

As shown in FIG. 4(a), the adhesive sheet 58 is placed on the support sheet 50, and the sheet of copper foil 60 is placed on the adhesive sheet 58, and then all of the layers are pressed so that they become joined to each other. Due to the pressing operation, material of the adhesive sheet 58 fills the cavity 56, so that the buffer layer 34 is formed, and at the same time, the sheet of copper foil 60 is made to adhere onto the buffer layer 34 and the support sheet 50.

In order to provide a buffer action by the buffer layer 34, the adhesive sheet 58 is made of material the elastic modulus of which is low, such as NBR, or epoxy resin or acrylic resin in which material the elastic modulus of which is low is dispersed. Further, the adhesive sheet 58 is made of rubber material of polyolefin, silicon or fluorine. Concerning the material of the buffer layer 34, the elastic modulus of which is low, it is preferable to use material the Young's modulus of which is not higher than 1 GPa at 30° C.

The adhesive sheet 58 of predetermined thickness is used so that the cavities 56 are filled with the adhesive sheet 58.

In this embodiment, the depth of the cavity 56 was about 100 μm. A thermoplastic sheet (the Young's modulus was about 400 MPa at 30° C. and about 3 MPa at 150° C.) of epoxy of about 120 μm thickness was used for the adhesive sheet 58. Concerning the sheet of copper foil 60, a sheet of electrolytic copper foil of 18 μm thickness was used, heated and pressurized, i.e. it was cured and integrated into a single body at 150° C. for 2 hours.

FIG. 4(b) is a view showing a state in which the sheet of copper foil 60 is made to integrally adhere onto the support sheet 50. In the cavity 56, the copper foil 60 is supported by the support sheet 50 via the buffer layer 34 filled with the material of the adhesive sheet 58. At the partitioning section 54a of the frame-shaped sheet 54, the sheet of copper foil 60 is made to adhere via the adhesive layer 58a. The adhesive layer 58a is a thin adhesive layer the thickness of which is 20 to 30 μm, which is left after the adhesive sheet 58 has been heated and pressurized. Since the thickness of the adhesive layer 58a is small, no problems are caused by its buffer action in the process of wire bonding.

Next, etching is conducted on the sheet of copper foil 60 so as to form a wiring pattern 16. FIG. 5(a) is a view showing a state of forming a resist pattern 62 on which a surface of the sheet of copper foil 60 is coated with resist so as to coat a portion on which the wiring pattern 16 is formed. When the sheet of copper foil 60 is etched while the resist pattern 52 is being used as a mask, it becomes possible to form the wiring pattern 16 having the land 24 and the wire bonding section 16a as shown in FIG. 5(b).

Next, photosensitive solder resist is coated on the entire surface including the wiring pattern 16. Then, exposure and development are carried out. In this way, a protective film 39 from which only the lands 24 and the wire bonding section 16a are exposed can be formed as shown in FIG. 5(c).

When the wiring pattern 16 is designed, consideration must be given to the land 24 being displaced on the plane direction (direction X-Y) and also in the thickness direction (direction Z). Therefore, it is preferable that the wiring pattern 16 not be designed having a linear shape, but having a curved shape so that it can be displaced in directions X-Y and Z.

After the protective film 39 has been formed, protective plating such as nickel plating or gold plating may be conducted on the surfaces of the land 24 and the wire bonding sections 16a.

Finally, when the large size support sheet 50 is divided into pieces by the partitioning section 54a, it is possible to provide a wiring board 30 the lands 24 of which are supported by the buffer layer 34 and the wire bonding sections 16a of which are supported by the bonding support layer 36. On the wiring board 30 of this embodiment, the bonding support layer 36 and the buffer layer 34 are supported by the base support layer 38.

Since the support sheet 50 composed of the base sheet 52 and frame-shaped sheet 54 is made of material the elastic modulus of which is high, it is possible to maintain the profile of the support sheet 50, which is advantageous when it is being handled and transported.

In this connection, the method of manufacturing the wiring board 30 is not limited to the above specific method in which the sheet of copper foil 60 is made to adhere by using the adhesive sheet 58 simultaneously when the cavities 56 are filled. The following method may also be adopted. The cavities 56 are filled with buffer material such as resin which becomes the buffer layer 34 by the method of coating. After that, a conductive layer such as a copper layer is formed on the surfaces of the buffer layer 34 and the bonding support layer 36 by means of spattering, and etching is conducted on this conductive layer so that the wiring pattern 16 having the predetermined lands 24 and the wire bonding sections 16a can be formed.

The semiconductor device is manufactured as follows by using the above wiring board 30. The wiring board 30 is mounted when the base support layer 38 is made to adhere onto the electrode forming face of the semiconductor element 10. The wire bonding sections 16a are connected with the electrodes of the semiconductor element 10 by the method of wire bonding. The bonding wires 40 are sealed by the method of potting, and the external connecting terminals 22 such as solder balls are joined to the lands 24.

In this connection, in the case where the wiring substrate 30 is made to adhere to the semiconductor element 10, an adhesive film may be previously made to adhere onto the bottom face of the wiring board 30, or alternatively before the large size support sheet 50 is divided into the wiring boards 30, an adhesive film may be made to adhere onto the back face of the support sheet 50 so as to provide a wiring board 30 having the adhesive film on it.

Figure 6:
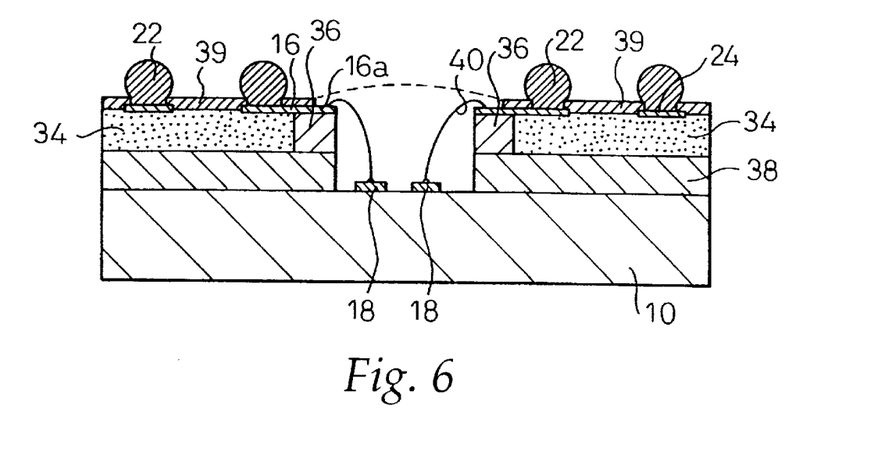
FIG. 6 is a cross-sectional view showing another arrangement of a semiconductor device.

In the above embodiment, the semiconductor device is formed such that the wiring board 30 is mounted on the semiconductor element 10 in which the electrodes 18 are arranged in the periphery of the electrode forming face. However, depending upon the semiconductor element 10, the electrodes 18 can be arranged on the central side of the electrode forming face. FIG. 6 is a view showing an example in which the electrodes 18 are arranged on the central side of the electrode forming face. In this arrangement, the electrodes 18 and the wiring pattern 16 on the wiring board 30 are connected with each other by the method of wire bonding, and the lands 24 are connected with the external connecting terminals 22 so as to compose the semiconductor device. Also, in this embodiment, when the lands 24 are supported by the buffer layer 34 and the wire bonding sections 16a of the wiring pattern 16 are supported by the bonding support layer 36, wire bonding can be conducted in a satisfactory manner. After wire bonding has been conducted between the electrodes 18 and the bonding sections 16a, the bonding wires 40 and the electrodes 18 are sealed by the method of potting so as to compose the semiconductor device.

As described above, in the semiconductor device of the present invention, when the configuration of the wiring board 30 is designed according to the arrangement positions of the electrodes 18 on the electrode forming face of the semiconductor element 10, it becomes possible to provide semiconductor devices for various semiconductor elements 10.

FIGS. 7(a) to 7(g) are views showing a method of manufacturing a semiconductor device of the present invention, in which the wiring board 30 is mounted on a semiconductor wafer 70. In the embodiment described before, the semiconductor device is provided wherein the individual pieces of wiring boards 30 are mounted on the semiconductor element 10 which has been divided into individual chips. However, it is also possible to provide a semiconductor device wherein the wiring board 30 is mounted on a semiconductor wafer 70 and divided into individual pieces.

Figure 7A:
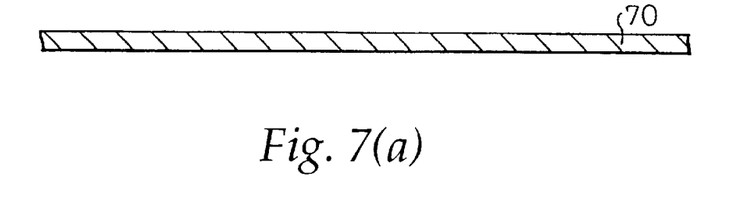
FIGS. 7(a) to 7(g) are schematic illustrations for explaining a method of manufacturing a semiconductor device of the present invention in which a wiring board is mounted on a semiconductor wafer.
Figure 7B:
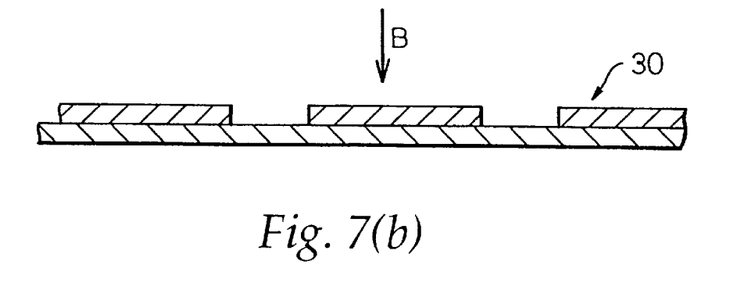
Figure 10:
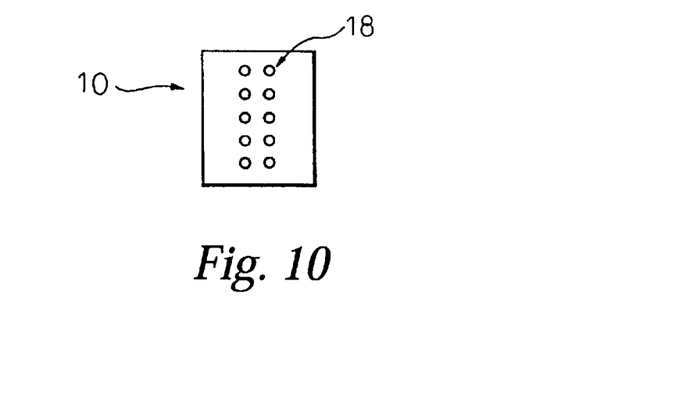
FIG. 10 is a plan view showing a semiconductor chip taken in the direction of arrow C in FIG. 9(b).

A plurality of semiconductor chips 10 shown in FIG. 10, are formed on the semiconductor wafer 70 shown in FIG. 7(a). In each semiconductor chip, a plurality of electrodes 18 are formed along the periphery on the electrode forming face (the upper face in [the drawing] FIG. 10.

The wiring board 30 which has been formed as described above is previously cut into individual pieces. Each wiring board 30 is positioned and mounted at the center of the electrode forming face of each semiconductor chip 10, i.e., each wiring board 30 is mounted inside the electrode 18 as shown n FIG. 7(c).

Figure 8:
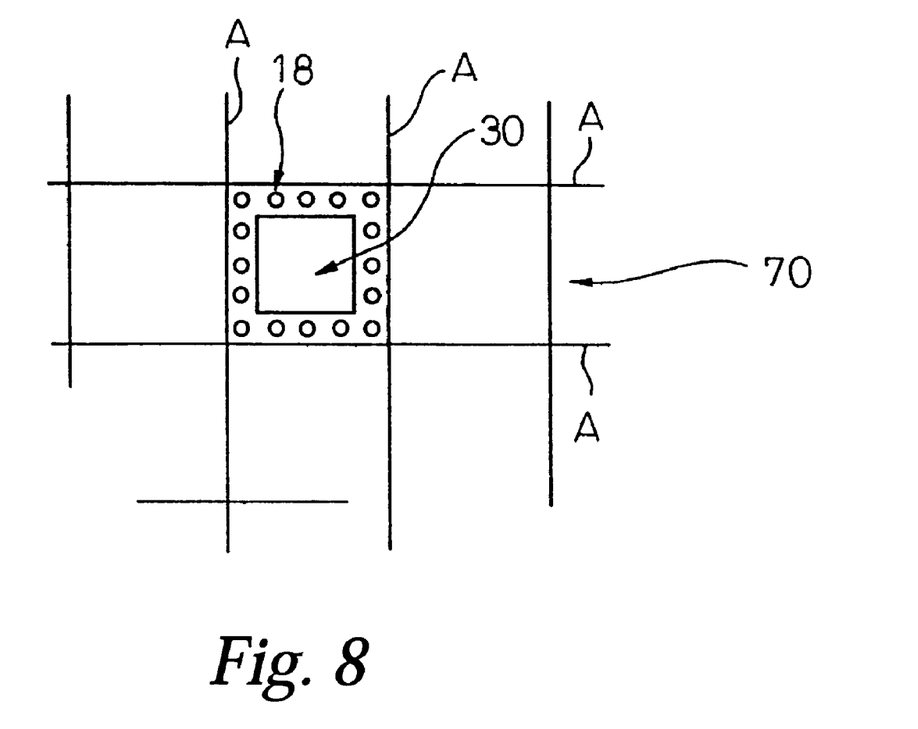
FIG. 8 is a plan view of a chip portion taken in the direction of arrow B in FIG. 7(b).

Although not shown in the drawing, each wiring board 30, which has been cut into an individual piece, has a structure as shown in FIG. 5(c). When each wiring board 30 is mounted on and joined to the semiconductor wafer 70, it is possible to use the adhesive layer 32 shown in FIG. 1. In this connection, FIG. 8 is a plan view showing a state in which each wiring board 30 is mounted on the semiconductor wafer 70, wherein this plan view is taken in the direction of arrow B.

Figure 7C:
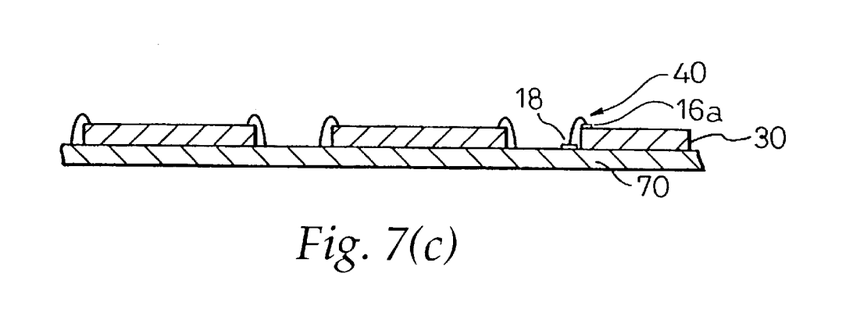
Figure 7D:
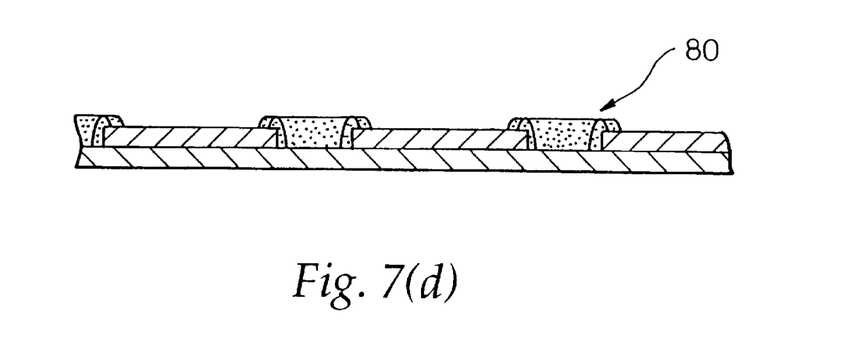

Next, the electrode 18 of the semiconductor chip 10 formed on the semiconductor wafer 70 is connected with the wire bonding section 16a of the wiring board 30 by the wire 40, using the method of wire bonding as shown in FIG. 7(c). Next, the bonded portion is sealed by potting resin 80, i.e. the region, which includes the electrode 18 of the semiconductor chip 10, the bonding wire 40 and the bonding section 16a of the wiring pattern 16, is sealed by potting resin 80 as shown in FIG. 7(d). In this case, resin sealing is conducted over the entirety of the adjacent chip and wiring board 30.

Figure 7E:
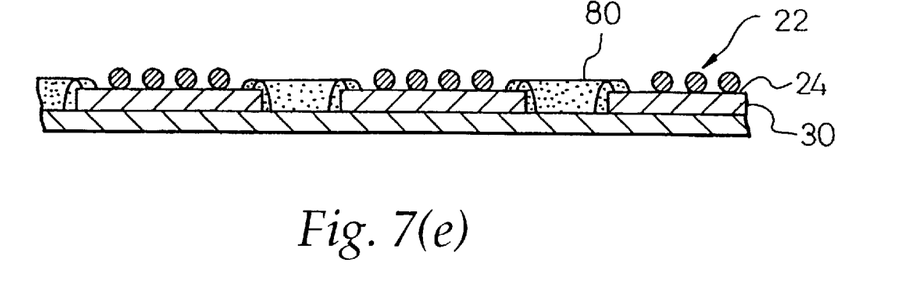
Figure 7F:
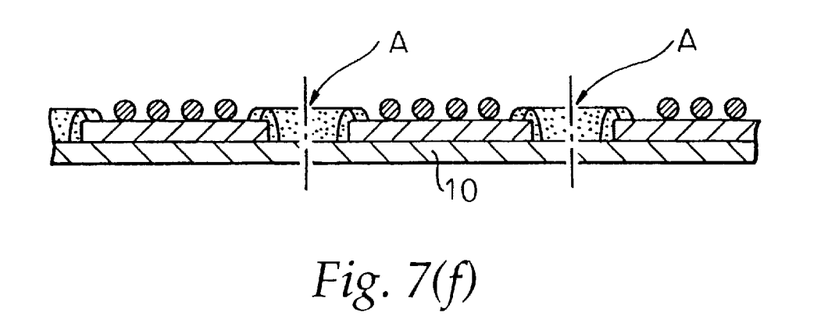
Figure 7G:
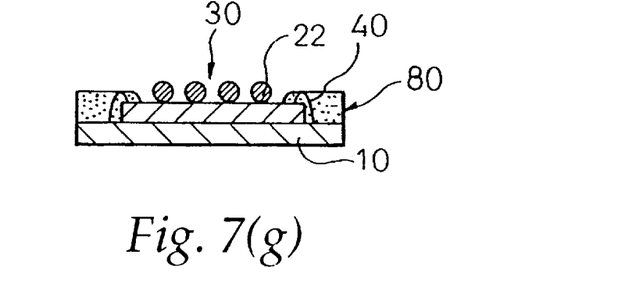

Next, as shown in FIG. 7(e), a solder ball 22, which is an external connecting terminal, is joined to the land 24 of each wiring board 30. Thereafter, the resin sealing portion 80 of the semiconductor wafer 70 is cut along cutting line A as shown in FIG. 7(f) so that it can be separated into individual pieces. In this way, the individual semiconductor devices can be provided as shown in FIG. 7(g).

Figure 9A:
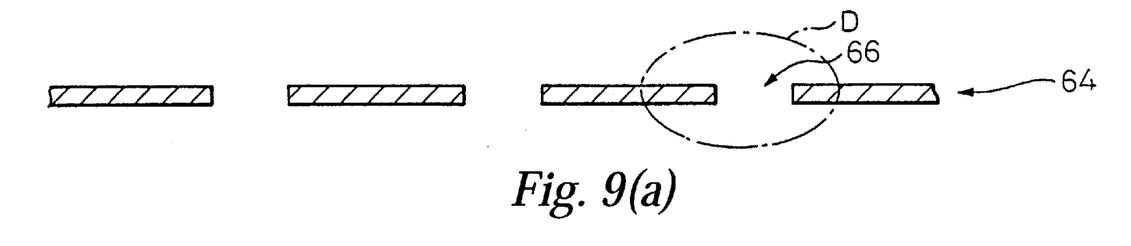
FIGS. 9(a) to 9(g) are schematic illustrations of a method of manufacturing another semiconductor device of the present invention in which a semiconductor chip is mounted on a large size wiring board having an opening.
Figure 11:
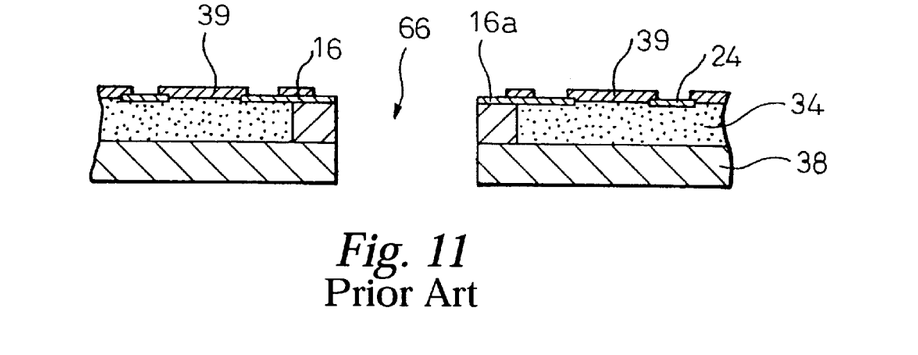
FIG. 11 is an enlarged cross-sectional view in which a portion indicated by mark D is enlarged.

FIGS. 9(a) to 9(g) are views showing a method of manufacturing a semiconductor device of the present invention, in which the individual semiconductor chips 10 are mounted on the large size wiring board 64 having the openings 66. Although not shown in these drawings, the peripheries of the openings 66 of the large size wiring board 64 are composed as shown in FIG. 11. In other words, the embodiment shown in these drawings has the same structure as that of the wiring board to obtain the semiconductor device shown in FIG. 6. FIG. 9(a) is a view showing this large size wiring board 64. The rectangular openings 66 are arranged in a grid-pattern.

FIG 11 is an enlarged view of the portion indicated by D in FIG. 9(a).

Figure 9B:
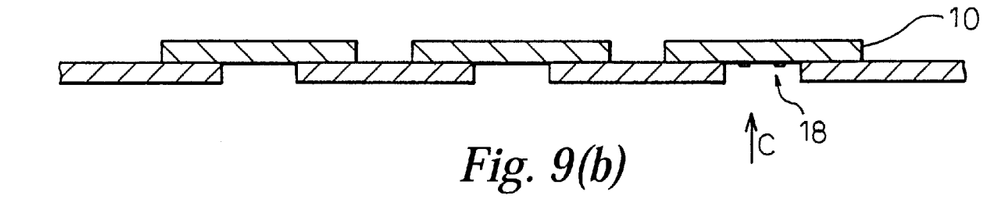

In the embodiment shown in the drawings, the individual semiconductor chips 10, the openings 66 of which are larger, are mounted on the openings 66 of the large size wiring board 64 so that the plurality of electrodes 18 can be located inside the openings 66 as shown in FIG. 9(b). In this connection, when the semiconductor chip 10 is joined to the wiring board 64, it is possible to use the adhesive layer 32 shown in FIG. 1 in the same manner as that of the embodiment described before. FIG. 10 is a plan view showing an arrangement of the electrodes of the semiconductor chips, wherein the view is taken in the direction of arrow C. As described above, the electrode 18 is formed at the center of the electrode forming face of the semiconductor chip 10 in this embodiment.

Figure 9C:
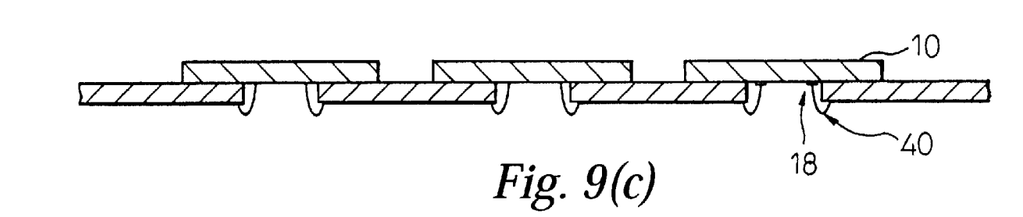

Next, bonding connection is conducted between the electrode 18 of the semiconductor chip 10 and the wire bonding 16a of the wiring pattern 16 of the wiring board 64 by the wire 40 as shown in FIG. 9(c).

Figure 9D:
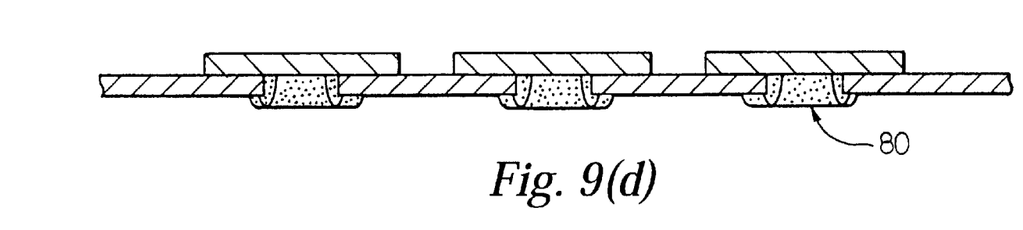
Figure 9E:
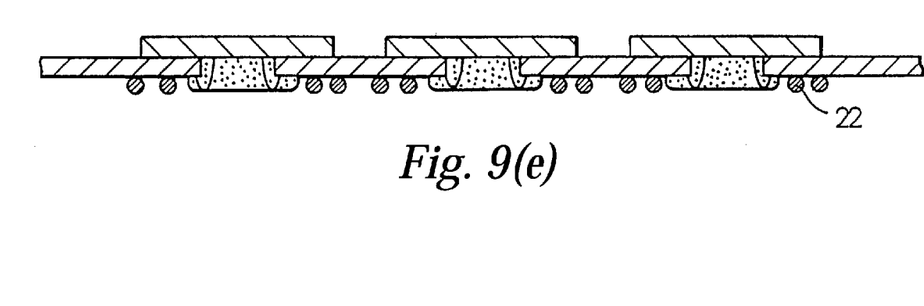
Figure 9F:
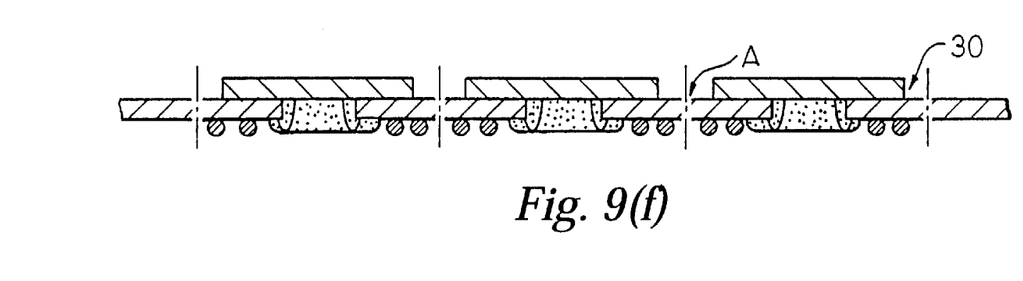
Figure 9G:
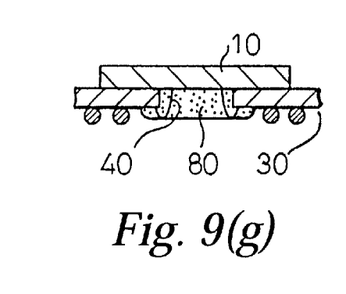

Next, the bonded portion is sealed by potting resin 80, i.e. the central region of the semiconductor chip 10, which includes the electrode 18 of the semiconductor chip, the bonding wire 40 and the wire bonding 16a of the wiring pattern 16, is sealed by potting resin 80 as shown in FIG. 9(d). Next, a solder ball 22, which is an external connecting terminal, is joined to the land 24 of the wiring board 64 as shown in FIG. 9(e). Thereafter, the large size wiring board 64 is cut at a predetermined position between the adjacent semiconductor chips 10 along cutting line A as shown in FIG. 9(f) so as to obtain the individual wiring boards 30. In this way, each piece of semiconductor device can be provided as shown in FIG. 9(g).

The reference numeral 66 in FIG. 11 refers to an opening of the portion D in FIG. 9(a).

INDUSTRIAL POSSIBILITIES

According to the wiring board and the semiconductor device of the present invention, it is possible to connect the wiring pattern with the electrodes of the semiconductor element by the method of wire bonding. Therefore, the connecting operation can be conducted easily and effectively. By virtue of this, productivity can be enhanced. By virtue of the above structure, the thermal stress can be significantly reduced in the process of mounting. Accordingly, the present invention can provide a highly reliable product. According to the method of manufacturing the wiring board and the semiconductor device of the present invention, it is possible to manufacture the wiring board easily and effectively, and the thermal stress acting on the external connecting terminal can be greatly reduced in the process of mounting. Therefore, the present invention can provide a semiconductor device which is a highly reliable product. As described above, the industrial possibilities of the present invention are excellent.

What is claimed is:

1. A wiring board comprising:

a base support layer defining a first face which is to be joined to an electrode forming face of a semiconductor element;

a buffer layer and a bonding support layer both attached to the base support layer to define a second face on the opposite side of the first face;

wiring patterns formed on the second face, the wiring patterns being provided at one end thereof with lands formed on the buffer layer and at the other end thereof with wire bonding sections formed on the bonding support layer, the wiring bonding sections are connected with electrodes of the semiconductor element by means of bonding wires; wherein an elastic modulus of the bonding support layer is larger than that of the buffer layer so that wire-bonding is possible on the bonding support layer.

2. A wiring board according to claim 1, wherein the buffer layer is made of material the Young's modulus of which is not more than 1 GPa at 30° C., and the bonding support layer is made of material the Young's modulus of which is not less than 4 GPa at room temperature.

3. A wiring board according to claim 1, wherein a plurality of wire bonding sections are arranged in a peripheral section of the second face, and a plurality of lands are arranged inside the region in which the wire bonding sections are arranged.

4. A wiring board according to claim 1, wherein an opening penetrating from the first face to the second face is formed, a plurality of wire bonding sections are arranged in a peripheral section of the opening on the second face, and a plurality of lands are arranged outside the region in which the wire bonding sections are arranged.

5. A wiring board according to claim 1, wherein the buffer layer and the bonding support layer are supported by a base support layer the elastic modulus of which is the same as that of the bonding support layer, a side of the base support layer composes the first face, and sides of the buffer layer and the bonding support layer compose the second face.

6. A wiring board according to claim 1, wherein a plane configuration of a wiring pattern formed on the second face is formed into a curve.

7. A semiconductor device comprising:

a semiconductor element having an electrode forming face, on which electrodes are formed;

a wiring board comprising a base support layer defining a first face which is jointed to the electrode forming face of the semiconductor element; a buffer layer and a bonding support layer to define a second face on the opposite side of the first face;

wiring patterns formed on the second face, the wiring patterns being provided a one end thereof with lands formed on the buffer layer and at the other end thereof with wiring bonding sections formed on the bonding support layer; and an elastic modulus of the bonding support layer being larger than that of the buffer layer so that wire-bonding is possible on the bonding support layer; and bonding wires for electrically connecting the electrodes of the semiconductor element with the bonding sections of the wiring board.

8. A semiconductor device according to claim 7, wherein the buffer layer is made of material the Young's modulus of which is not more than 1 GPa at 30° C., and the bonding support layer is made of material the Young's modulus of which is not less than 4 GPa at room temperature.

9. A semiconductor device according to claim 7, wherein a plurality of electrodes are arranged in a peripheral section on an electrode forming face of the semiconductor element, a plurality of wire bonding sections are arranged in a peripheral section on the second face of the wiring board, a plurality of lands are arranged inside the region in which the wire bonding sections are arranged, and the wiring board is mounted on the electrode forming face of the semiconductor element in a region inside the electrode.

10. A semiconductor device according to claim 7, wherein a plurality of electrodes are arranged at the central region of the electrode forming face of the semiconductor element, an opening penetrating from the first face to the second face is formed on the wiring board, a plurality of wire bonding sections are arranged in the periphery of the opening on the second face, a plurality of lands are arranged outside the region in which the wire bonding sections are arranged, and the wiring board is mounted on the electrode forming face of the semiconductor element in the region outside the electrode.

11. A semiconductor device according to claim 7, wherein the wiring board is composed such that the buffer layer and the bonding support layer are supported by the base support layer, the elastic modulus of which is the same as that of the bonding support layer, a side on the base support layer forms the first face, and sides on the buffer layer and the bonding support layer compose the second face.

12. A semiconductor device according to claim 7, wherein the wiring board is formed such that a plane configuration of the wiring pattern formed on the second face is a curve.

* * * * *

UNITED STATES PATENT AND TRADEMARK OFFICE
CERTIFICATE OF CORRECTION

PATENT NO. : 6,455,786 B1
DATED : September 24, 2002
INVENTOR(S) : Horiuchi et al.

It is certified that error appears in the above-identified patent and that said Letters Patent is hereby corrected as shown below:

Title page,
After Item "[21] Application No. 09/276,606," insert the following lines:
Item: -- [22]  PCT Filed: August 3, 1999
        [86]  PCT No. PCT/JP00/04169 --;
Please add: Item: -- [30] Foreign Application Priority Data, August 3, 1998 (JP) 10-218851 --.

Column 1,
Line 4, please insert -- This is a continuation of national stage entry of PCT/JP99/04169, filed on August 3, 1999 --.

Signed and Sealed this

Eighteenth Day of February, 2003

JAMES E. ROGAN
*Director of the United States Patent and Trademark Office*